United States Patent [19]

Mori

[11] Patent Number: 4,500,397
[45] Date of Patent: Feb. 19, 1985

[54] METHOD FOR THE PREPARATION OF A PYROELECTRIC MATERIAL

[75] Inventor: Toshio Mori, Kanagawa, Japan

[73] Assignee: Sony Corporation, Tokyo, Japan

[21] Appl. No.: 478,556

[22] PCT Filed: Jul. 27, 1982

[86] PCT No.: PCT/JP82/00290

§ 371 Date: Mar. 24, 1983

§ 102(e) Date: Mar. 24, 1983

[87] PCT Pub. No.: WO83/00404

PCT Pub. Date: Feb. 3, 1983

[30] Foreign Application Priority Data

Jul. 27, 1981 [JP] Japan ............................ 56-117551
Jul. 29, 1981 [JP] Japan ............................ 56-117806
Jul. 29, 1981 [JP] Japan ............................ 56-117807

[51] Int. Cl.$^3$ .................... C25D 13/02; C25D 13/20
[52] U.S. Cl. ........................ 204/181 T; 201/181 N; 201/181 R
[58] Field of Search ............ 204/181 N; 427/26, 27, 427/29, 45.1; 204/181 R, 181 T

[56] References Cited

U.S. PATENT DOCUMENTS

| 2,843,541 | 7/1958 | Senderoff et al. | 204/181 N |
| 3,481,839 | 12/1969 | Iwoue | 204/181 N |
| 3,503,860 | 3/1970 | Iwoue | 204/181 N |
| 4,204,933 | 5/1980 | Barlow et al. | 204/181 N |

FOREIGN PATENT DOCUMENTS

| 35-7619 | 6/1960 | Japan | 204/181 N |
| 51-48277 | 12/1976 | Japan | |

OTHER PUBLICATIONS

Kompanek, Harry Wilfred, "Dielectric Coating Compositions", *Chemical Abstracts*, 91:150149y, 1979.
Lang, S. B., *Source book of Pyroelectricity*, Gordon and Breach Science Publishers, New York (1974) pp. 69-78.

*Primary Examiner*—John F. Niebling
*Assistant Examiner*—B. J. Boggs, Jr.
*Attorney, Agent, or Firm*—Hill, Van Santen, Steadman & Simpson

[57] ABSTRACT

When a polycrystal or pyroelectric crystal material is manufactured by deposition of pyroelectric crystal particles in a layer, a temperature change or gradient is applied to pyroelectric binding particles which are dispersed between a pair of opposing electrodes (13, 14), before said particles are deposited on one (13) of the electrodes, for forming a layer of pyroelectric binding particles on the electrode (13) with the pyroelectrical axes of the particles oriented in advance of deposition thereof. Such temperature change or gradient may be produced by vaporization of a liquid dispersion (12) of the pyroelectric binding articles near its surface with resultant cooling of the electrode (13) and in the near-by zone in such a manner that the liquid temperature is decreased as the crystal particles approach the electrode (13). As a result, apparent electrical dipoles are produced in the pyroelectric crystal particles, whereby the pyroelectrical axes are oriented in the same direction and polarity before the particles are affixed to the electrode (13).

14 Claims, 9 Drawing Figures

METHOD FOR THE PREPARATION OF A PYROELECTRIC MATERIAL

TECHNICAL FIELD

This invention relates to a method for the preparation of a polycrystal or complex pyroelectrical body or material by deposition of pyroelectrical crystal particles in a layer. More particularly, it relates to a method for preparation of a pyroelectrical material wherein pyroelectric crystal particles are dispersed between an opposing pair of electrodes with an electrical field established therebetween whereby the particles are polarized and deposited for providing a layer of the pyroelectric crystal particles with oriented pyroelectrical axes.

BACKGROUND

Reference is first made to a pyroelectric material as used in the present invention. In general, a piezoelectric material may be classified into a pyroelectric material and a non-pyroelectric material, depending on the presence and absence of spontaneous polarization. The pyroelectric material may further be classified into a ferroelectric material and a non-ferroelectric material, depending on whether the direction or sense of the spontaneous polarization $P_s$ can be switched by application of an electrical field or not. Hence, a pyroelectrical material can be used without exception as a piezoelectric material, and some of the pyroelectric materials can be used as ferroelectric materials. As characteristic of the pyroelectric material, it shows a pyroelectric effect, that is, the property that electrical charges are produced on the surface upon heating a part of the material. This property of the material is utilized for application of the material in the field of infrared sensors and heat sensitive elements.

Pyroelectric materials usually exist as single crystals or polycrystals or a complex with other materials. In general, single crystals can be manufactured only with considerable equipment and material costs and prolonged time. Moreover, the single crystals of a larger or a desired size can not be produced easily. On the contrary, the polycrystal and complex materials have advantages over the single crystals in any of these respects, that is, equipment and material costs, manufacture time and capability to be manufactured to a large or desired size. It is to be noted that the polycrystal pyroelectric material is formed only of pyroelectric crystal material and hence exhibits more intense pyroelectric effect than the complex pyroelectric material.

According to known methods for manufacture of such polycrystal or complex pyroelectric material, crystal particles or powders of ferroelectric material in which the sense of spontaneous polarization can be switched rather easily, such as $BaTiO_3$ particles, are baked to a solid layer, to which an electrical field is applied for orienting the spontaneous polarization $P_s$ substantially in the same direction (poling process). However, only ferroelectric material showing spontaneous polarization that can be switched easily in the sense or direction can be used as starting material, but neither the ferroelectric material showing spontaneous polarization that can not be switched easily in the sense or direction nor non-ferroelectric material can be used for the preparation of a polycrystal or complex pyroelectric material. In addition, the sense of spontaneous polarization can not be aligned perfectly when the poling operation is performed on the baked material, and the pyroelectric properties then obtained are usually inferior to those possessed by the single crystal pyroelectric material.

In contrast to the prior art, discussed above, the present invention contemplates providing a method for the preparation of a pyroelectric material wherein any material showing pyroelectric properties can be used for preparation of the polycrystal or complex pyroelectric material with substantially uniformly aligned sense or direction of the spontaneous polarization $P_s$, or in other words, with the pyroelectrical axes aligned in the same direction or polarity.

DISCLOSURE OF THE INVENTION

The method for the preparation of a pyroelectric material according to the present invention is characterized by dispersing pyroelectric crystal particles between an opposing pair of electrodes, and establishing an electrical field between said pair of electrodes for causing the particles to be deposited in a layer on one of said electrodes, with a temperature gradient being applied to said particles before deposition of the particles for orienting the pyroelectric axes of the particles in the layer. In this case, apparent electrical dipoles are produced in the pyroelectric crystal particles due to such change or gradient in temperature with these particles being deposited in a layer on said one of the electrodes while being oriented in the same direction and polarity under the effect of the electrical field. Hence it is possible to obtain polycrystal or complex pyroelectric material in the form of a layer of polarized pyroelectric crystal particles by using pyroelectric crystal particles in which it is difficult or impossible to switch the direction or sense of spontaneous polarization $P_s$. It is sufficient to use pyroelectric crystal particles in which it is difficult or impossible to switch the direction or sense of spontaneous polarization $P_s$, which means not only that inexpensive pyroelectric material of higher quality can be manufactured from a wide range of starting material, but also that the pyroelectric material of a superior quality can be obtained when ferroelectric materials endowed with capability of switching of the direction or sense of spontaneous polarization $P_s$ are employed, since then the pyroelectrical axes of the individual particles can be aligned with higher accuracy.

The opposing pair of electrodes used in the present method can be mounted in a liquid dispersion with the pyroelectric crystal particles dispersed therein or in a free space in which case the liquid dispersion with the pyroelectric crystal particles dispersed therein may be sprayed into a zone delimited between the opposing electrodes.

BEST MODE FOR EXECUTING THE INVENTION

Figure 1A:
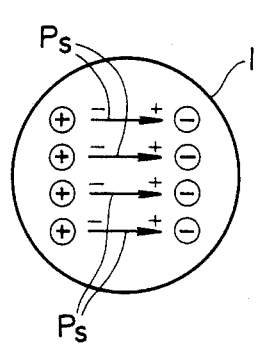
FIGS. 1 A and B are schematic views for explaining the pyroelectric effect.
Figure 1B:
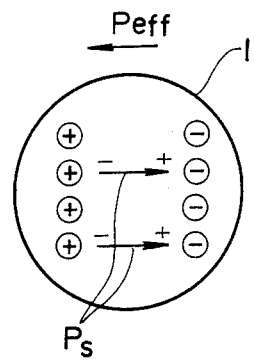

Before proceeding to the description of the embodiments of the present invention, reference is made to FIGS. 1A and 1B for elucidation of general properties of pyroelectric crystal particles.

The inner state of a pyroelectric crystal particle in the quiescent state is shown schematically in FIG. 1A, wherein the arrow marks represent spontaneous electric polarization $P_s$ and the plus and minus marks in circles represent inner charges or electric dipoles. It is assumed that one arrow mark $P_s$ is electrically equivalent to a pair of the inner charges (plus and minus marks in circles). In the quiescent state shown in FIG. 1A, spontaneous polarization $P_s$ is cancelled or balanced by the equal amount of the inner charge pairs, so that the apparent charge or apparent electric dipole of the pyroelectric crystal particle is zero. When the crystal particle 1, placed under the quiescent state, is subjected to a temperature change such that spontaneous polarization $P_s$ has decreased as shown in FIG. 1B, the amount of inner charge pairs surpasses that of spontaneous polarization $P_s$, effectively resulting in the inner charge pairs being equal in amount to the difference between the amount of the inner charge pairs and that of spontaneous polarization $P_s$. Thus, electric dipoles as shown by the arrow mark $P_{eff}$ in FIG. 1B appears in the pyroelectric crystal particles 1. Following such temperature change, the charge pairs equal to the above difference are combined to one another and disappear as a function of so-called dielectric relaxation time (phenomenon of relaxation), until the quiescent state or balanced state in which the inner charge pairs are equal to spontaneous polarization $P_s$ is again reached. It is to be understood that the sense of change in the amount of polarization $P_s$ (increase or decrease) depends on the sense of change in temperature (rise or fall of temperature) and, when the amount of polarization $P_s$ has increased and exceeded that of the inner charge pairs, the apparent electric dipole $P_{eff}$ has the same sense as $P_s$ and the phenomenon of relaxation takes place in the sense to produce new inner charge pairs.

The method of electric deposition by electrophoresis, sometimes called simply the method of electric deposition, is now described.

Figure 2:
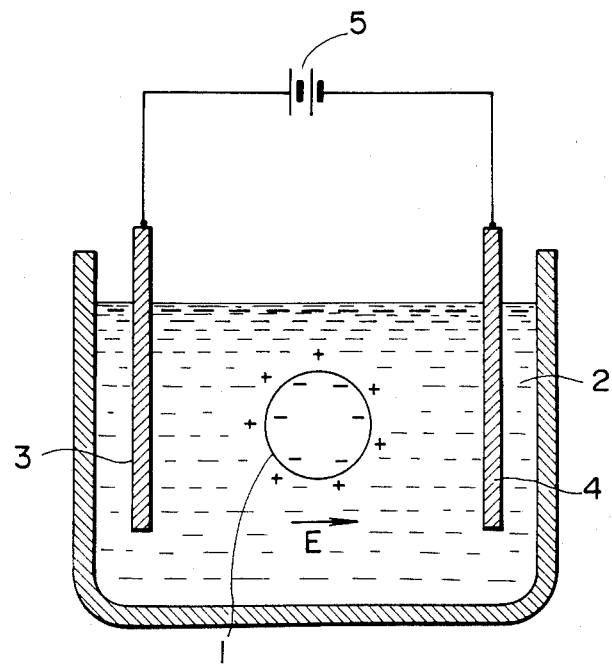
FIG. 2 is a schematic sectional view for explaining a method for deposition of a particle by electrophoresis.

In general, when dispersed in a liquid, solid particles assume plus or minus charges. For example, in FIG. 2, the solid particles 1 (dispersed particles) in a liquid (dispersion medium) assume negative charges. When a pair of electrodes 3, 4 are mounted in the dispersion medium 2 in opposition to and at a certain distance from each other, and a d.c. voltage is applied across these electrodes 3, 4 from a d.c. source 5, the particles are displaced by an electric field E towards the positive electrode 3 (electrophoresis) to be deposited in layers on the surface of the electrode 3 serving as substrate. This phenomenon is utilized in painting or other fields as electrophoretic deposition method. It is to be understood that electrophoresis takes place in the direction of the negative side electrode when the dispersed particles assume positive charges.

In the method of the present invention for manufacture of a pyroelectric material making use of electrophoresis, pyroelectric crystal particles including ferroelectric or nonferroelectric crystal grains such as LiNbO$_3$, LiTaO$_3$, BaTiO$_3$ or zirconium-lead titanate materials (PZT and the like) are used as dispersed particles, whereas a liquid having higher specific resistance ($P > 10^6$ ohm-cm) such as trichloroethylene is used as said liquid dispersion medium. Furthermore, according to the present invention, each crystal particle should undergo uniform rise or fall of temperature until each particle migrates towards and is secured to the surface of the electrode or substrate as a result of electrophoresis caused by the above electric field. To this end, a temperature gradient may be afforded to the liquid dispersion medium along the direction of electrophoresis, or the liquid may be heated or cooled in part or as a whole. Alternatively, the crystal particles migrating towards the electrode surface may be heated directly by radiation of light or micro wave of a certain wavelength that can be easily absorbed by the crystal particles. In such case it is preferred that the particles should be tinted differently according to the absorption wavelength or subjected to similar surface processing. In this manner, the particles migrating towards the electrode surface under the electrical field undergo uniform changes in temperature so that electric dipoles corresponding to the pyroelectric polarity are produced under the aforementioned pyroelectric effects. Thus the particles migrate towards the electrode surface while being polarized under the electric field and are affixed to and deposited on the electrode surface. The deposited layer is taken out of the liquid and dried to a layer of polarized pyroelectric crystal particles, or a polycrystal pyroelectric material.

According to an alternative method of the present invention for manufacture of a polycrystal pyroelectric material, that is, a spray method, the pyroelectric crystal particles are dispersed in an organic liquid of good electrical insulation and high resistivity ($P > 10^{10}$ ohm-cm, as an example) to a colloidal liquid which is then sprayed on the surface of an electrode or a substrate to which a vertical electrical field is applied. In this manner, polarized crystal particles, that is, crystal particles with pyroelectric axes oriented in the same direction and polarity, are formed in layer on the substrate surface. A polycrystal pyroelectric material may be obtained by drying this crystal particle layer for vaporizing or decomposing organic compounds.

The polycrystal pyroelectric material obtained by these methods can be baked if necessary to a layer of baked material. A complex pyroelectric material can also be produced by mixing or dispersing glass or the like material into the dispersion medium as binder or by impregnating other materials into the layer of the polycrystal particles taken out of the liquid or into the dried or baked pyroelectric material.

Hence, according to the present invention, it is possible to use pyroelectric material in which the sense of spontaneous polarization can not be switched or can be switched only with considerable difficulties. Moreover, when using a ferroelectric material in which it is possible to switch the sense of spontaneous polarization, pyroelectric axes of the individual particles can be made to be substantially coincident so that polycrystal or complex pyroelectric materials of superior quality can be obtained easily.

A preferred embodiment of the present invention is now described.

The method for manufacture of a polarized polycrystal pyroelectric material by using as starting pyroelectric crystal material $LiNbO_3$ which is a ferroelectric crystal with the switching of spontaneous polarization $P_s$ being substantially impossible at ambient temperature, is now described as a first embodiment of the present invention.

Single crystals of $LiNbO_3$ are comminuted in a mortar and precipitated in ethanol for separation to $LiNbO_3$ powders consisting only of particles less than 1 μm diameter. These powders are dispersed as aforementioned particles in a liquid dispersion medium. Since trichloroethylene is employed as such liquid dispersion medium, the $LiNbO_3$ powders must be rendered oleophilic by surface treatment. To this end, the above powders were mixed into toluene added with a silane coupling agent (such as SZ-6070 manufactured by Toray Silicone Co. Ltd.) and thoroughly agitated under application of supersonic waves. The powders were recovered by using a centrifugal separator, washed thoroughly with toluene and dried with a hot air drier. The $LiNbO_3$ powders thus surface treated were dispersed thoroughly in the trichloroethylene dispersion medium under application of supersonic waves. The $LiNbO_3$ particles in trichloroethylene exhibit negative charges.

Figure 3:
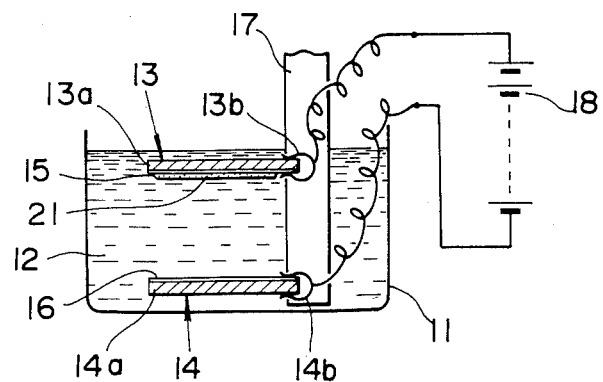
FIG. 3 is a sectional view showing a first embodiment of the present invention.

A vessel 11 shown in FIG. 3 is filled with a liquid dispersion 12 in which the $LiNbO_3$ powders are dispersed in trichloroethylene. Two electrode plates 13, 14 are placed horizontally in the liquid dispersion so as to face to each other vertically (in the up down direction in the drawing). These electrode plates 13, 14 are formed by glass plates 13a, 14a, the surfaces (especially the opposing surfaces) of which are coated with electrically conductive nesa films ($SnO_2$ films) serving as electrodes. These electrode plates 13, 14 are supported horizontally by an electrode support post 17 made e.g. from Teflon and connected electrically to a d.c. source 18 by conductive metal fittings 13b, 14b and lead wires. The upper electrode plate 13 in the drawing is positioned near the liquid surface of the liquid dispersion 12 so that the plate and the near-by region is cooled by the heat produced by vaporization at the liquid surface. An electrical voltage of about 5 kV is applied across the electrodes, with the electrode plate 13 being used as positive pole (or anode). In this manner, the $LiNbO_3$ particles are deposited in a layer or layers on the nesa film 15 of the positive electrode plate 13 and are cooled near the electrode plate 13 by evaporation of trichloroethylene at the liquid surface, thus resulting in formation of apparent electrical dipoles and orientation of the pyroelectric axes to a predetermined direction and polarity (polarization).

The layer 21 of the $LiNbO_3$ particles thus deposited under polarization on the opposing surfaces of the electrode plate 13 is taken out of the liquid quietly together with the electrode plate 13 and dried to a polarized polycrystal pyroelectric material, which can be baked if necessary to a baked pyroelectric product.

Figure 4:
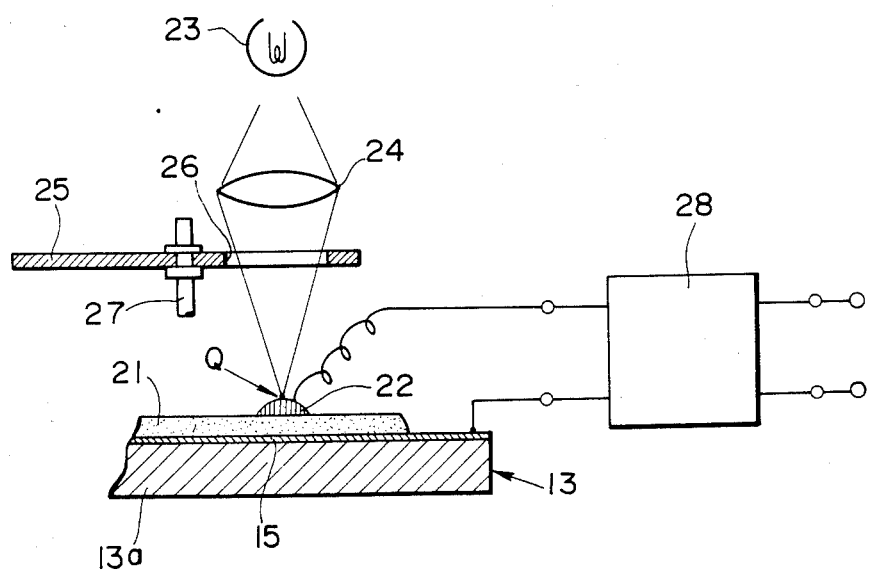
FIG. 4 is a schematic sectional view showing an exemplary device for testing a pyroelectric material.

FIG. 4 shows an example of a testing device for testing pyroelectric effects of the thus obtained polycrystal pyroelectric material 21. In this Figure, the light emanated from a light source 23 such as incandescent lamp or infrared lamp is focussed by a lens 24 and collected at a point Q on the surface of the pyroelectric material 21 for raising the temperature of this point Q. A rotary disc 25 having an opening 26 is placed as light shutter between the lens 24 and the pyroelectric material 21 and rotated about an axis 27 to turn the light irradiation of the point Q on or off to cause a change or gradient in temperature. An electrode 22 about 2 mm diameter is mounted as by depositition of silver paste to the point Q on the polycrystal pyroelectric body 21 and is electrically connected as with a lead to one terminal of a high sensitivity ampere meter. A lead wire is led out from e.g. the nesa film 15 on the back side of the body 21 and electrically connected to the other terminal of the high sensitivity ampere meter 28.

Figure 5:
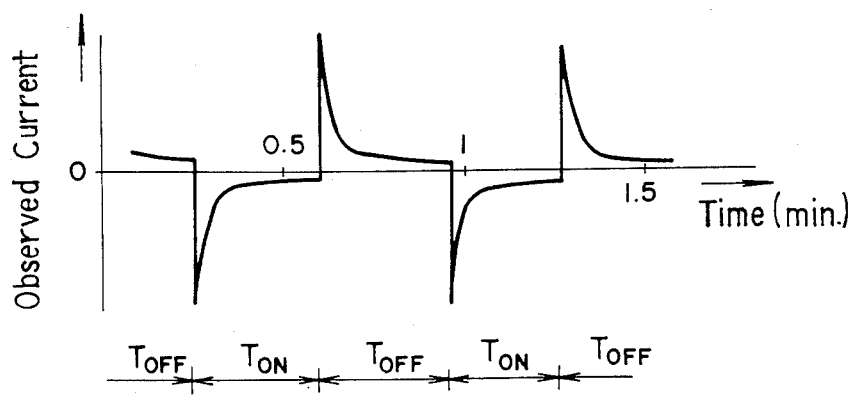
FIG. 5 is a time chart showing current signals obtained from the device of FIG. 4.

The current as measured with the ampere meter 28 when the rotary disc 25 in such testing device is driven in rotation is shown in FIG. 5. In FIG. 5, the time interval $T_{ON}$ that the light from the source 23 reaches the point Q through the opening 26 corresponds to the state of temperature increase, while the time interval $T_{OFF}$ that the light is interrupted by the disc 25 corresponds to the state of temperature decrease, thus indicating the presence of pyroelectric effects.

When the polycrystal pyroelectric body is obtained by electrophoretic deposition under a substantially uniform temperature change or gradient, the resulting pyroelectric effects are uniform throughout the overall area as already described with reference to FIG. 3. However, when the temperature change is not uniform as in the case shown in FIG. 2, only local orientation may be obtained with occasional fluctuations in pyroelectric effects and thus the resulting pyroelectric material was not usable practically. This is probably because local temperature increase has been caused due to application of supersonic waves aimed at dispersing the pyroelectric crystal particles into the liquid medium.

Figure 6:
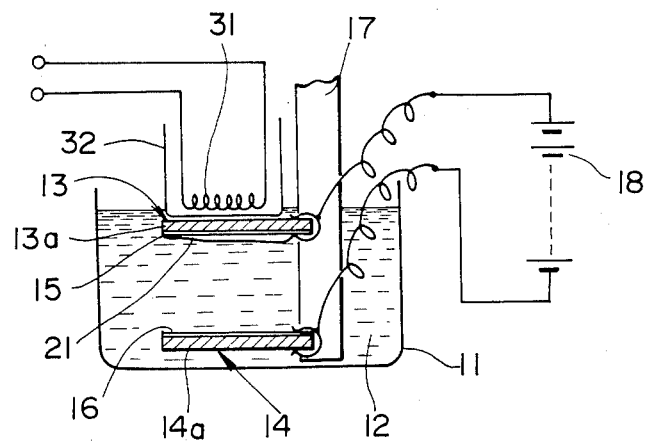
FIG. 6 is a sectional view showing a second embodiment of the present invention.

Reference is made to FIG. 6 showing a second embodiment of the present invention.

In this Figure, a vessel 11 is filled with a liquid dispersion 12 in which powder-like $LiNbO_3$ particles are dispersed in trichloroethylene and two electrode plates 13, 14 are placed in a vertically facing relation, as in the embodiment of FIG. 3. However, in the second embodiment shown in FIG. 6, a heater 31 such as heater coil is mounted near the upper electrode plate 13 for heating only the region near the electrode plate 13. It is to be noted that the heater 31 is accommodated in a quartz vessel 32 or the like vessel made of insulating material and is placed near the surface of the liquid dispersion 12 for preventing direct contact between the heater 31 and the liquid dispersion 12.

When the heating takes place in the upper zone of the liquid dispersion 12, so-called liquid convection is not caused and the temperature distribution is substantially uniform such that the liquid temperature has a rising gradient from the lower zone towards the upper zone in the liquid. Thus the powder-like $LiNbO_3$ particles are raised in temperature while they migrate by electrophoresis towards the upper electrode plate 13 under the electrical field applied across the opposing electrodes, and are deposited in a layer on the surface of the nesa film 15 while being polarized by the apparent electrical dipoles caused by pyroelectric effects. The sense of polarization is reverse to that of the embodiment of FIG. 3 wherein the particles are lowered in temperature while migrating towards the upper electrode.

As mentioned above, polarized particles of a polycrystal pyroelectric material are formed in a layer on one of opposing electrodes by subjecting these particles to a rising or falling change in temperature while these particles are migrating by electrophoresis towards said one of the opposing electrodes. The electrode structure such as shown in FIG. 7 is preferably employed for preventing disturbance or eventual loss of the layer of pyroelectric particles likely to occur while the electrode is taken out of the liquid dispersion.

Figure 7:
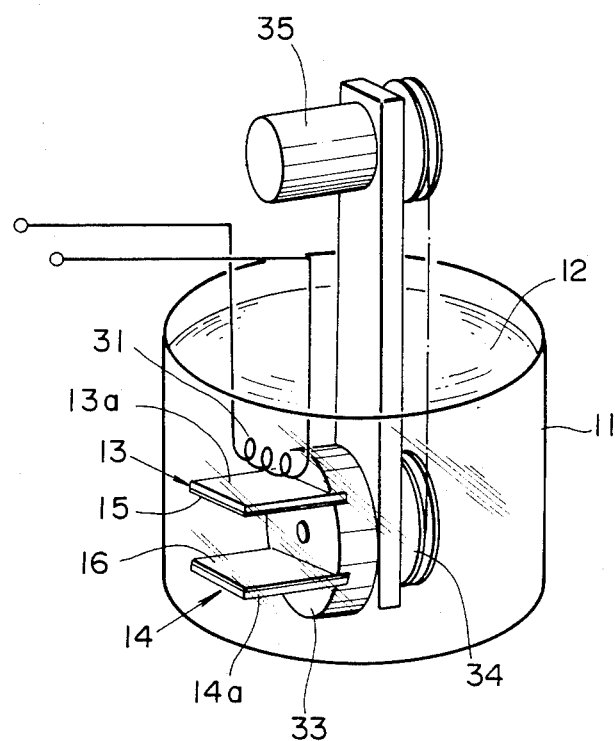
FIG. 7 is a sectional view showing a third embodiment of the present invention.

A third embodiment of the present invention effective to prevent such trouble of the layer during taking out of the electrode is shown in FIG. 7, wherein a pair of electrode plates 13, 14 are supported by a disc-like rotary table 33 made e.g. from Teflon and a pulley 34 mounted on a shaft of the rotary table 33 is driven in rotation by an electric motor 35. The remaining portions are the same as those shown in FIGS. 3 and 6 and indicated by the same reference numerals as those used in these Figures and the corresponding description is omitted for simplicity.

In the third embodiment shown in FIG. 7, the electrode plates 13, 14 are immersed in the liquid dispersion 12, with the plate 13 of the positive pole side (the side on which the pyroelectric material is formed by electrical deposition) disposed at a higher position (that is, with the nesa film 15 facing downwardly). An electrical voltage of approximately 5 kV is applied across the electrodes, while only the region near the electrode plate 13 is heated by the heater 31. After lapse of a predetermined time interval, e.g. ten minutes, almost all $LiNbO_3$ particles are affixed in a layer on the nesa film 15 on the electrode plate 13. At this time, the table 33 is rotated slowly, with the d.c. voltage being still applied and the two electrodes still immersed in the dispersion 12, until the electrode plate 13 is moved to a lower position and the opposing surface (nesa film) of the electrode faces upwards. The rotation of the table 33 is now stopped. The d.c. voltage is also turned off, and the electrodes 13, 14 are raised slowly together with the table 33. In this manner, the layer of the deposited particles on the electrode plate 13 may be taken out of the liquid without loss. Alternatively, the d.c. voltage may still be applied during such raising of the electrode plates. At this time, since it is the electrode plate 14 that emerges first from the liquid, it may be presumed that any substantial electrical field is not applied to the layer after such emergence and hence no electrostatic force is applied to the layer when the electrode plate 13 carrying the layer emerges from the liquid.

The foregoing three embodiments refer to a so-called electrophoretic method wherein a pair of opposing electrodes are mounted in a liquid dispersion with dispersed particles of pyroelectric crystal particles. A fourth embodiment described below refers to the aforementioned spray method.

In this fourth embodiment of the invention, $LiNbO_3$ crystals are used as pyroelectric crystals. These particles are subjected to comminution, separation by precipitation and oleophilizing surface treatment with silane coupling agent to powder-like $LiNbO_3$ particles in the same manner as in the preceding Examples 1 to 3. These particles are dispersed thoroughly in trichloroethylene or the like liquid under application of supersonic waves to a colloidal solution. About 0.1 wt. percent of solid paraffin may be added in advance to trichloroethylene.

Figure 8:
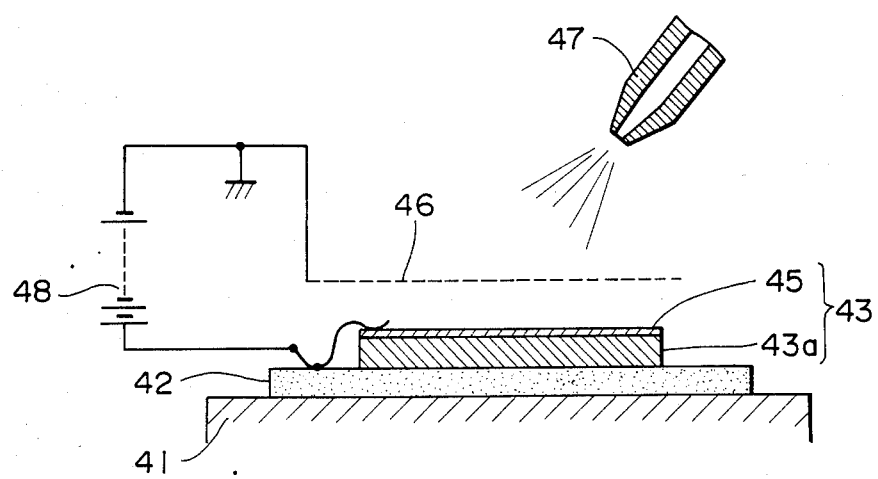
FIG. 8 is a sectional view showing a fourth embodiment of the present invention.

Next, as shown in FIG. 8, a quartz plate 42 or the like electrically insulating plate is placed on a heating plate 41, and a substrate 43 which serves also as electrode is placed on the quartz plate 42. This substrate 43 is formed by a glass plate 43a on one surface of which is coated an electrically conductive transparent nesa film ($SnO_2$ film) 45 serving as one electrode. About 5 mm above this nesa film 45, there is placed a counter electrode 46 in the form of a wire screen, and a d.c. source 48 is connected across these electrodes 45, 46. A d.c. voltage of about 2 kV is impressed across these electrodes for generating an electrical field, and the above colloidal solution is sprayed by a spray nozzle into a space where the electrical field is generated. In FIG. 8, the spray port of the nozzle 47 is positioned outside of the electrode 46, however, it may be positioned between the electrodes 45 and 46.

When the colloidal solution is ejected through the spray nozzle 47, the $LiNbO_3$ particles dispersed therein are cooled by the heat of vaporization of trichloroethylene being sprayed. When the solution has reached the nesa film 45 of the substrate 43, trichloroethylene is vaporized by being heated by the heating plate 11 so that latent heat of vaporization is absorbed from the particles thus cooling these particles in the similar manner. Thus the heating plate 11 is heated to about 200° C. for vaporizing trichloroethylene with resultant cooling of the $LiNbO_3$ particles. During such cooling, electric dipoles appear in each $LiNbO_3$ particle due to the aforementioned pyroelectric effect so that the particles are deposited in a layer on the nesa film 15 of the substrate 13 while the pyroelectric axes thereof are oriented in the same direction and polarity (polarization). When the layer has reached the thickness e.g. of about 0.2 mm, the spraying operation may be terminated and the layer may then be taken out along with the substrate 13 following cooling. When paraffin has been added to the liquid dispersion as mentioned above, the layer may be heated along with the substrate to about 300° C. in an electric oven to remove paraffin by vaporization or cracking. If necessary, a platinum plate or the like heat-resistant plate may be used as substrate and baked at a higher temperature to a baked substrate plate.

In the present embodiment, orientation of the pyroelectric axes is thought to occur by the following mechanism. When the colloidal solution has been sprayed, numerous $LiNbO_3$ crystal particles are contained in each droplet of the colloidal solution. Since these particles are cooled rapidly by absorption of the latent heat of vaporization of trichloroethylene, electric dipoles corresponding to respective pyroelectric axes will appear in respective crystal particles contained in the droplets, these axes being oriented in the same direction and polarity under the impressed electrical field. Upon vaporization of liquid trichloroethylene, the sprayed particles are turned into secondary particles consisting of the $LiNbO_3$ particles that are oriented in the above manner and deposited in a layer on the substrate electrode.

The spray nozzle used in this fourth embodiment for spraying the colloidal solution may be replaced by a supersonic spraying apparatus (so-called humidifier). The supersonic spraying apparatus allows a stable spraying operation for a prolonged time and yields uniformly polarized $LiNbO_3$ particles.

The particles may undergo temperature increase instead of temperature decrease through absorption of the heat of vaporization. For example, the particles may be heated by the aforementioned heating table to overcome the effect of cooling which is obtained through absorption of the heat of vaporization. Alternatively, the crystal particles sprayed towards the electrode surface may be heated directly by radiation of micro waves or the light having wavelengths specific to the particles. In this case, the crystal particles may be tinted or otherwise processed superficially for indicating their specific absorption wavelengths. In this manner, the particles thus sprayed and approaching the electrode surface undergo uniform changes in temperature so that electrical dipoles will appear under the pyroelectric effects and the particles will be deposited on the electrode surface while being polarized under the electrical field. The layer of the deposited particles may then be dried to a layer of polarized pyroelectric crystal particles, that is, a polycrystal pyroelectric material, which may be baked if desired. Complex pyroelectric bodies may also be obtained easily.

In the first to fourth embodiments, mentioned above, electrical deposition or spraying is used for yielding a polycrystal pyroelectric material consisting only of pyroelectric crystal particles. However, in an unbaked state, the bonding force acting among the crystal particles and between the particles and the substrate is rather low. In addition, when the pyroelectric crystal particles are oxides, the baking temperature is higher, so that the substrate electrode material is required to be highly heat-resistant and hence inexpensive material such as glass plate can not be used as electrode material. With this in view, the method for manufacture of a complex pyroelectric body, with contents as binder of materials other than the pyroelectric crystal particles, is now described below.

In the method for manufacture of such complex pyroelectric material, vitreous materials, solid paraffin etc. may be used as such binder. These materials may be dispersed in advance into a liquid dispersion such as trichloroethylene, or impregnated into the layer of pyroelectric crystal particles once formed on the electrode and subsequently taken out and dried.

The fifth and sixth embodiments described below are directed to the former method for manufacture of the complex pyroelectric material, while the seventh and eighth embodiments to the latter method for manufacture of such material.

Referring first to the fifth embodiment of the present invention, in the process for manufacture of a pyroelectric material consisting of $LiNbO_3$ crystal particles by the electric deposition method of the first to third embodiments as mentioned above, about 0.1 wt. percent of solid paraffin is dissolved in advance into a trichloroethylene dispersion medium. The resulting layer of the deposited particles may be taken out of the liquid along with the electrode and dried to a complex pyroelectric material having a uniformly reinforced binding force among the particles and between the particles and the electrode plate. This fifth embodiment allows the binder to be impregnated uniformly and without inclusion of air bubbles, as compared to the case wherein paraffin etc. is impregnated to the completed polycrystal pyroelectric material, with resultingly improved binding force.

The sixth embodiment of the invention is directed to the manufacture of a complex pyroelectric material consisting essentially of pyroelectric crystal particles and vitreous materials as binder. The vitreous material, such as powdered solder glass with a lower melting point, is used as binder. The material is comminuted in a mortar in the same manner as $LiNbO_3$ particles used in the first embodiment, and precipitated in ethanol to powders less than about 1 $\mu m$ in diameter. The resulting powders are oleophilized by surface processing and recovered by a centrifugal separator. These powders were thoroughly washed with toluene and dried with a hot air drier. About 10 wt. percent of the resulting solder glass powders with oleophilized surfaces less than 1 $\mu m$ in diameter are mixed to the $LiNbO_3$ powders, and the resulting mixture is dispersed thoroughly in trichloroethylene to a colloidal solution under application of supersonic waves. A pair of opposing electrodes are placed in the solution to effect deposition of the particles on the electrode surface by electrophoresis under application of a substantially uniform change of temperature, in the same manner as in the first to third embodiments mentioned above. The particles deposited in this manner on the electrode plate and oriented in their pyroelectric axes are then taken out of the solution and heated to about 500° C. in an electrical oven. The $LiNbO_3$ particles may thus be fused to the electrode substrate with the aid of the solder glass as binder.

When the sixth embodiment is adapted for use with the spray method according to the fourth embodiment, 1.0 g of the surface processed $LiNbO_3$ particles and 0.1 g of the glass powders are dispersed into 50 cc of trichloroethylene, in which 0.1 g of solid paraffin is dissolved in advance, under application of supersonic waves, and the resulting colloidal solution is then sprayed into a space between the opposing electrodes for depositing the pyroelectric crystal particles on the substrate electrode under application of a substantially uniform temperature change or gradient. The particles thus deposited on the electrode plate with oriented pyroelectric axes may then be heated to about 480° C. by using an electrical oven for fusing the $LiNbO_3$ particles to the electrode substrate by a solder glass as binder.

The complex pyroelectric material of the sixth embodiment obtained upon heating as mentioned above is superior in heat resistance and need not be treated to an elevated temperature involved in the baking process, so that the nesa glass substrate used as electrode may be used in situ as substrate for the pyroelectric material. It is moreover possible to obtain a complex pyroelectric material in which there is no inclusion of air bubbles and a binding force among the particles and between the substrate and the binder can be reinforced uniformly. A material that is turned into glass upon heat treatment may be used as binder.

The latter method for manufacture of the complex pyroelectric material mentioned above consists of the step of depositing pyroelectric crystal particles on the substrate with oriented pyroelectric axes to a layer of a polycrystal pyroelectric material and the step of impregnating said layer with a binder.

Thermoplastic organic materials or organic materials hardened upon copolymerization such as paraffin, vinyl chloride-vinyl acetate copolymers, polyurethane, epoxy resin or polyester resin in solution, can be used either singly or in combination as aforementioned binder. A mixed system that is turned ultimately into a binder through cracking or combination caused by heating, as for instance an aqueous solution of borate anhydride and lead acetate that is turned ultimately into lead borate type glass, may also be used as binder.

Referring now to the seventh embodiment of the present invention, a layer of pyroelectric crystal particles is formed on the electrode by electrodeposition or spraying and dried to a polarized polycrystal pyroelectric material in the manner described in the first to fifth embodiments. Since the surface of the crystal particles of the pyroelectric material is oleophilized by the aforementioned surface treatment, when the dissolved paraffin, transparent lacquer paint diluted with a thinner or the like oily solvent is impregnated into these particles, the solvent permeates into the particle interstices and is turned into a binder which binds the crystal particles to one another and the crystal particles to the substrate. Moreover, when the layer formed of pyroelectric crystal particles is heated at about 500° C., silane coupling agents are cracked and vaporized from the surface of $LiNbO_3$ crystal particles, hydrophilizing the particle surface. An aqueous solution of polyvinyl alcohol (PVA) may then be permeated into the polycrystal pyroelectric body which may then be dried to a complex pyroelectric material.

According to the eighth embodiment of the present invention, a mixed system solution ultimately turned into a vitreous material by heating, is used as binder.

In this eighth embodiment, a polycrystal pyroelectric material consisting of a layer of polarized and deposited pyroelectric crystal particles is produced by the process similar to that of the aforementioned first to fourth embodiments. A mixed aqueous solution consisting of the following ingredients may be used as a mixed liquid system that is turned into vitreous material upon heating.

| | |
|---|---|
| $(B_2O_3)$ | 3.48 g |
| lead acetate $(Pb(CH_3CO_2)_2.3H_2O)$ | 18.96 g |
| water $(H_2O)$ | 100 g |
| acetic acid $(CH_3COOH)$ | trace (less than 1 g) |

Since the polycrystal pyroelectric material is oleophilized at the crystal particle surface zone thereof, it is first processed by heating at about 450° C. for cracking or vaporizing the silane coupling agent and hydrophilizing the crystal particle surface, and impregnated thoroughly with the mixed aqueous solution. After spontaneous drying, the resulting pyroelectric material is heated at about 480° C. for 30 minutes in an electrical oven. In this manner, the layer of the $LiNbO_3$ crystal particles is fused vitreously resulting in formation of a complex pyroelectric material with a strong binding force. Such increase in the binding force caused by vitreous fusion is not accompanied with any appreciable decrease in pyroelectrical properties.

According to the eighth embodiment, vitreous material can be impregnated uniformly without inclusion of air bubbles as compared to the case of impregnating a colloidal solution with dispersed glass particles wherein glass particles tend to block the particle interstices and are prohibited from permeation. Moreover, there may be obtained a complex pyroelectric material with superior pyroelectric properties and improved packing density of pyroelectric crystal particles.

In the eighth embodiment, mixed solutions that may be turned into glass such as zinc borate, barium borate, alkaline aluminium phosphate or alkaline lead silicate may be used as binder in addition to the mixed solution for providing a vitreous composition of the lead borate system. It has also been found that addition of a trace amount of ethanol or soap to the aqueous solution is helpful to permeate the solution into the layer of the crystal particles.

It is to be noted that various changes can be made without departing from the purport of the invention and the present invention is not limited to the foregoing embodiments which are given only by way of illustrative examples.

I claim:
1. A method for the preparation of a pyroelectric structure comprising:
   dispersing solid, discrete crystalline pyroelectric particles between an opposing pair of electrodes,
   establishing an electric field between said electrodes with a sufficient magnitude to cause said particles to be deposited in a layer on one of said electrodes, and
   changing the temperature of said particles before deposition of said particles on said one electrode, the temperature change being sufficient to orient the pyroelectric axes of the crystal particles in the deposited layer.

2. A method according to claim 1, wherein said temperature of said particles is changed between the time they enter said electric field and the time they are deposited in said layer.

3. A method for the preparation of a pyroelectric structure comprising:
   dispersing solid, discrete crystalline pyroelectric particles in a liquid and placing the resulting dispersion between an opposing pair of electrodes,
   establishing an electric field between said electrodes with a sufficient magnitude to cause said particles in said dispersion to be deposited in a layer on one of said electrodes, and
   changing the temperature of said particles before deposition of said particles on said one electrode, the temperature change being sufficient to orient the pyroelectric axes of the crystal particles in the deposited layer.

4. A method according to claim 3 wherein said temperature of said particles is changed between the time they enter said electric field and the time they are deposited in said layer.

5. A method according to claim 3 wherein the temperatue change is effected by locally heating the electrode at which deposition takes place.

6. A method according to claim 3 wherein the temperature change is effected by vaporization of the liquid in said dispersion to thereby cool the electrode on which deposition takes place.

7. A method for the preparation of a pyroelectric structure comprising:
   spraying pyroelectric particles in a liquid dispersion into the space between two spaced electrodes,
   establishing an electric field between said spaced electrodes of sufficient intensity to cause said particles to be deposited as a layer on a substrate at the potential of one of said electrodes, and
   changing the temperature of said particles before deposition thereof to thereby orient the pyroelectric axes of the crystal particles in the deposited layer.

8. A method according to claim 7 wherein said temperature of said particles is changed between the time they enter said electric field and the time they are deposited in said layer.

9. A method for the preparation of a complex pyroelectric structure comprising:
   dispersing crystalline pyroelectric particles and a binder material between an opposing pair of electrodes,
   establishing an electric field between said electrodes with a sufficient magnitude to cause said particles to be deposited in a layer on one of said electrodes, and changing the temperature of said particles before deposition of said particles on said one electrode, the temperature change being sufficient to orient the pyroelectric axes of the crystal particles in the deposited layer to obtain a pyroelectric structure codeposited with said binder material.

10. A method according to claim 9 wherein:
said binder material is paraffin dispersed in an organic solvent.

11. A method according to claim 9 which includes the steps of:
premixing said pyroelectric particles with particles of a vitreous binder, and
heating the deposited layer to a temperature sufficient to fuse said binder.

12. A method according to claim 9 which includes the steps of:
dispersing particles of pyroelectric material and particles of a vitreous binder in a liquid vehicle having paraffin dissolved therein,
spraying the resulting colloidal solution into the space between said electrodes, and
thereafter heating the deposited layer to a temperature sufficient to fuse said vitreous binder to the electrode surface.

13. A method for the preparation of a complex pyroelectric structure comprising:
dispersing crystalline pyroelectric particles between an opposing pair of electrodes,
establishing an electric field between said electrodes with a sufficient magnitude to cause said particles in the dispersion to be deposited in a layer on one of said electrodes,
changing the temperature of said particles before deposition of said particles on said one electrode, the temperature change being sufficient to orient the pyroelectric axes of the crystal particles in the deposited layer and
impregnating binder material into the layer of the pyroelectric structure thus produced.

14. A method according to claim 13 wherein said binder material impregnated into said layer is a material which turns into a glassy material upon reaching an elevated temperature and the impregnated material is heated to said elevated temperature impregnation.

* * * * *